United States Patent
Lee et al.

(10) Patent No.: US 7,531,790 B2
(45) Date of Patent: May 12, 2009

(54) IMAGE SENSOR AND METHOD FOR FABRICATING THE SAME

(75) Inventors: Yun-Ki Lee, Seoul (KR); Duck-Hyung Lee, Sungnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/889,252

(22) Filed: Aug. 10, 2007

(65) Prior Publication Data

US 2008/0035836 A1     Feb. 14, 2008

(30) Foreign Application Priority Data

Aug. 11, 2006    (KR)  ........................ 10-2006-0076316

(51) Int. Cl.
     *G01J 3/50*      (2006.01)
     *H01J 5/16*      (2006.01)
(52) U.S. Cl. .................. 250/226; 359/569; 359/742
(58) Field of Classification Search ............. 250/208.1, 250/226; 359/569, 742, 112.03
See application file for complete search history.

(56) References Cited

U.S. PATENT DOCUMENTS

| 6,040,591 | A | 3/2000 | Otsuka |
| 7,221,513 | B2 | 5/2007 | Cho et al. |
| 2004/0211884 | A1 | 10/2004 | Fang et al. |
| 2005/0128332 | A1* | 6/2005 | Tsuboi .................. 348/333.12 |

FOREIGN PATENT DOCUMENTS

| JP | 10-270672 | 10/1998 |
| JP | 2005-317752 | 11/2005 |
| KR | 10-2004-0061658 | 7/2004 |
| KR | 10-2006-0005575 | 1/2006 |
| WO | WO 2005/070831 A1 | 8/2005 |

OTHER PUBLICATIONS

Thorpe, Larry and Tubbs, Gordon, "HDTV lens design: Management of chromatic aberrations", Canon White Papers, pp. 1-5, (Sep. 1, 2005).

\* cited by examiner

*Primary Examiner*—Seung C Sohn
(74) *Attorney, Agent, or Firm*—Lee & Morse, P.C.

(57) ABSTRACT

An image sensor includes at least one photoelectric conversion area on a semiconductor substrate, a color filter over the photoelectric conversion area, and an apochromatic microlens over the color filter.

19 Claims, 3 Drawing Sheets

IMAGE SENSOR AND METHOD FOR FABRICATING THE SAME

BACKGROUND OF THE INVENTION

1. Field of the Invention

Embodiments of the present invention relate to an image sensor and a method for fabricating the same. More particularly, embodiments of the present invention relate to an image sensor with an improved light convergence efficiency and a method for fabricating the same.

2. Description of the Related Art

In general, an image sensor refers to a device capable of converting optical signals to electrical signals. A conventional image sensor may include a photoelectric conversion area for converging light, a microlens to increase convergence efficiency of light on the photoelectric conversion area, and a wiring layer to transmit signals to an outer circuit with respect to the converged light on the photoelectric conversion area.

However, a conventional microlens of the image sensor may be formed of silicon oxide or of an organic substance, e.g., a polyimide-based material, thereby exhibiting chromatic aberration. In other words, a refractive index of light transmitted through the conventional microlens may significantly vary with respect to the wavelength of the transmitted light, thereby resulting in non-uniform focal lengths for different color filters. More specifically, chromatic aberration may cause longer focal lengths for longer wavelengths, so that a multi-color image sensor may have a distorted focus. A distorted focus may reduce light convergence on the photoelectric conversion area, thereby weakening and/or distorting generation of a corresponding electrical signal. Improper signal generation by the image sensor may impair light sensitivity and overall operation of the image sensor.

SUMMARY OF THE INVENTION

Embodiments of the present invention are therefore directed to an image sensor and a method for fabricating the same, which substantially overcome one or more of the disadvantages of the related art.

It is therefore a feature of an embodiment of the present invention to provide an image sensor with enhanced light convergence efficiency.

It is another feature of an embodiment of the present invention to provide a method for fabricating an image sensor with improved light sensitivity.

At least one of the above and other features and advantages of the present invention may be realized by providing an image sensor, including at least one photoelectric conversion area on a semiconductor substrate, a color filter over the photoelectric conversion area, and an apochromatic microlens over the color filter. The apochromatic microlens may include a fluorite-crystalline. The apochromatic microlens may be a calcium difluoride microlens. The image sensor may further include a plurality of apochromatic microlenses. The image sensor may be a complimentary metal-oxide semiconductor or a charge-coupled device.

At least one of the above and other features and advantages of the present invention may be further realized by providing a method for fabricating an image sensor, including forming at least one photoelectric conversion area on a semiconductor substrate, forming a color filter over the photoelectric conversion area, and forming an apochromatic microlens over the color filter.

Forming the apochromatic microlens may include depositing an apochromatic layer on the color filter and etching the apochromatic layer to form a curvature therein. Depositing the apochromatic layer may include vapor deposition or solid-state crystal growth. Etching the apochromatic layer may include forming a sacrificial pattern with a predetermined curvature on the apochromatic layer and successively etching the sacrificial pattern and the apochromatic layer, such that the predetermined curvature is imparted onto the apochromatic layer. Forming the sacrificial pattern may include forming a mask with a pattern on the apochromatic layer and deforming the pattern to form the predetermined curvature. Forming the sacrificial pattern may include forming a mask of a thermosetting resin. Forming the sacrificial pattern may include heating the mask.

Forming the apochromatic microlens may include forming the microlens of a fluorite-crystalline material. Forming the apochromatic microlens may include forming the microlens of a calcium difluoride crystal. Forming the apochromatic microlens of the calcium difluoride crystal may include a vapor deposition or a solid-state crystal growth. Forming the apochromatic microlens of the calcium difluoride crystal may include using hydrogen fluoride and alkaline-earth metal carbonate. Alternatively, forming the apochromatic microlens of the calcium difluoride crystal may include using potassium fluoride and calcium dichloride. In another alternative, forming the apochromatic microlens of the calcium difluoride crystal may include using barium difluoride and calcium dichloride. In yet another alternative, forming the apochromatic microlens of the calcium difluoride crystal includes using calcium hexafluosilicate and calcium dichloride.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
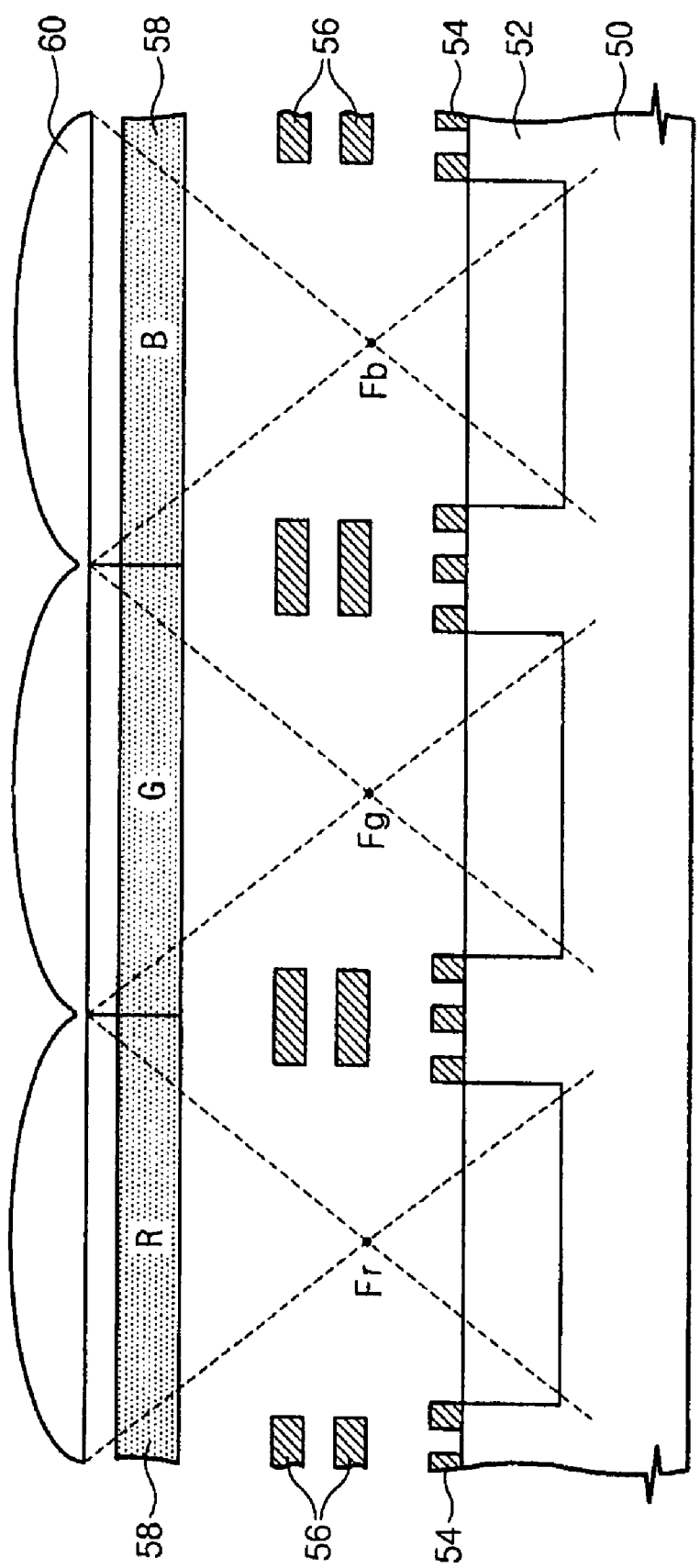
FIG. 1 illustrates an image sensor according to an embodiment of the present invention.

Korean Patent Application No. 10-2006-0076316 filed on Aug. 11, 2006, in the Korean Intellectual Property Office, and entitled: "Image Sensor and Method for Fabricating the Same," is incorporated by reference herein in its entirety.

Embodiments of the present invention will now be described more fully hereinafter with reference to the accompanying drawings, in which preferred embodiments of the invention are illustrated. Aspects of the present invention, may, however be embodied in many different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions are exaggerated for clarity of illustration. It will also be understood that when a layer or element is referred to as being "on" another layer or substrate, it can be directly on the other layer or substrate, or intervening layers or elements may also be present. Further, it will be understood that when a layer or element is referred to as being "under" another layer or element, it can be directly under, or one or more intervening layers or elements may also be present. In addition, it will also be understood that when a layer or element is referred to as being "between" two layers or elements, it can be the only layer or element between the two layers or elements, or one or more intervening layers or elements may also be present. Like reference numerals refer to like elements throughout.

An exemplary embodiment of an image sensor according to the present invention will now be described more fully with reference to FIG. 1. As illustrated in FIG. 1, an image sensor, e.g., a complimentary metal-oxide semiconductor (CMOS) type image sensor or a charge-coupled device (CCD) type image sensor, may include at least one photoelectric conversion area 52 on a semiconductor substrate 50, a gate electrode 54 adjacent to the photoelectric conversion area 52, a plurality of wiring layers 56, a color filter layer 58, and at least one microlens 60.

The photoelectric conversion areas 52 of the image sensor may be arranged on the semiconductor substrate 50 to form a plurality of pixels. Each photoelectric conversion area 52 may include an N-type photodiode formed in a P-type well, and a P-type photodiode may be formed on the N-type photodiode. The gate electrode 54 may be disposed on the semiconductor substrate 50 in order to control signal selection and/or transmission between the pixels on the semiconductor substrate 50 and outer circuitry (not shown). For example, in a CCD type image sensor, a signal transmission region may be formed in the semiconductor substrate 50 adjacent to the photoelectric conversion area 52 to transmit a photoelectrically converted signal to an output terminal.

A first insulation layer (not shown) may be disposed to cover an upper surface of the semiconductor substrate 50. The wiring layers 56 may be disposed on the first insulation layer, and may be connected between the pixels on the semiconductor substrate 50 and the outer circuitry to transmit signals therebetween. The wiring layers 56 may also function as a black matrix, i.e., prevent exposure of areas other than the photoelectric conversion areas 52 to light. A second insulation layer (not shown) may be disposed on the wiring layers 56.

The color filter layer 58 may be disposed on the second insulation layer, and may include a plurality of color filters. Each color filter of the plurality of color filters may individually transmit a red, a green, or a blue light towards the pixels on the semiconductor substrate 50. The color filters of the color filter layer 58 may be aligned above the photoelectric conversion area 52 in a predetermined pattern, such that each pixel on the semiconductor substrate 50 may exhibit a color corresponding to the color filter thereabove, and may transmit a respective electric signal.

The microlens 60 may be disposed above the color filter layer 58. More specifically, the image sensor may include a plurality of microlenses 60, so that each microlens 60 may overlap with a respective color filter of the color filter layer 58 to converge light of a specific wavelength on a corresponding photoelectric conversion area 52, i.e., a corresponding pixel. The microlens 60 may be convex, and may be apochromatic, e.g., may be formed of a low dispersion material. More specifically, the microlens 60 may be made of a crystalline material having superior apochromatic properties, e.g., calcium difluoride ($CaF_2$).

Use of an apochromatic microlens 60 may substantially minimize light refraction variation therethrough with respect to wavelengths of light, thereby providing a negligible focal length shift with respect to wavelengths of light. Accordingly, focal points of the red, green, and blue beams Fr, Fg, and Fb may be aligned on a substantially same vertical plane with respect to the semiconductor substrate 50, as illustrated in FIG. 1. Further, vertical alignment of focal points of different color filters may minimize loss of light in the photoelectric conversion areas 52 regardless of specific wavelength of light, thereby substantially improving efficiency of light incident on the photoelectric conversion areas 52, i.e., ratio between amount of light incident on the photoelectric conversion areas 52 and total amount of light detected by the image sensor. Additionally, vertical alignment, i.e., uniformity, of focal lengths may facilitate adjustment thereof to enhance light convergence on the photoelectric conversion area 52 even further, thereby increasing overall light sensitivity of the image sensor.

According to another embodiment illustrated in FIGS. 2-5, the image sensor described previously with respect to FIG. 1 may be fabricated as follows.

Figure 2:
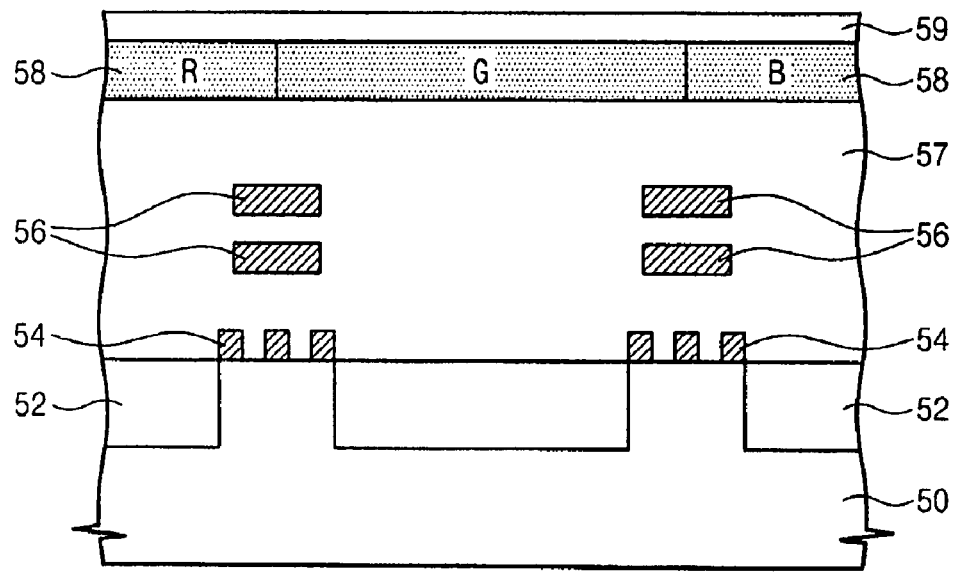
FIGS. 2-5 illustrate a method for fabricating an image sensor according to an embodiment of the present invention.

Referring to FIG. 2, a plurality of photoelectric conversion areas 52 may be formed on the semiconductor substrate 50 by any suitable means as determined by one of ordinary skill in the art, followed by formation of at least one gate electrode 54 on the semiconductor substrate 50. The at least one gate electrode 54 may be positioned between two adjacent photoelectric conversion areas 52. Additionally, a well (not shown) and a device isolation layer (not shown) may be formed on the semiconductor substrate 50. Further, if the image sensor is a CCD, a transmission layer (not shown) may be formed in the semiconductor substrate 50 to be connected to the photoelectric conversion area 52. In a peripheral circuit region, unit elements may be formed to control and drive signals.

Next, a dielectric layer 57 and a multi-level wiring layer 56 may be formed to cover the upper surface of the semiconductor substrate 50. The multi-level wiring layer 56 may be formed within the dielectric layer 57, and may be formed to selectively overlap with the gate electrode 54, as illustrated in FIG. 2. In other words, the multi-level wiring layer 56 may not overlap the photoelectric conversion area 52.

The color filter layer 58 may be formed on an upper surface of the dielectric layer 57, so that each color filter, i.e., red, green, and blue, may be disposed to correspond to a respective photoelectric conversion area 52. The color filters may have a uniform thickness or varied thicknesses with respect to light transmitted therethrough. Once the color filter layer 58 is formed, portions of the dielectric layer 57 overlapping the photoelectric conversion areas 52 may be removed. In other words, cavities may be formed between each color filter and its respective photoelectric conversion area 52 to increase light convergence in the photoelectric conversion areas 52. An insulation layer 59 may be formed on the color filter layer 58.

Figure 3:
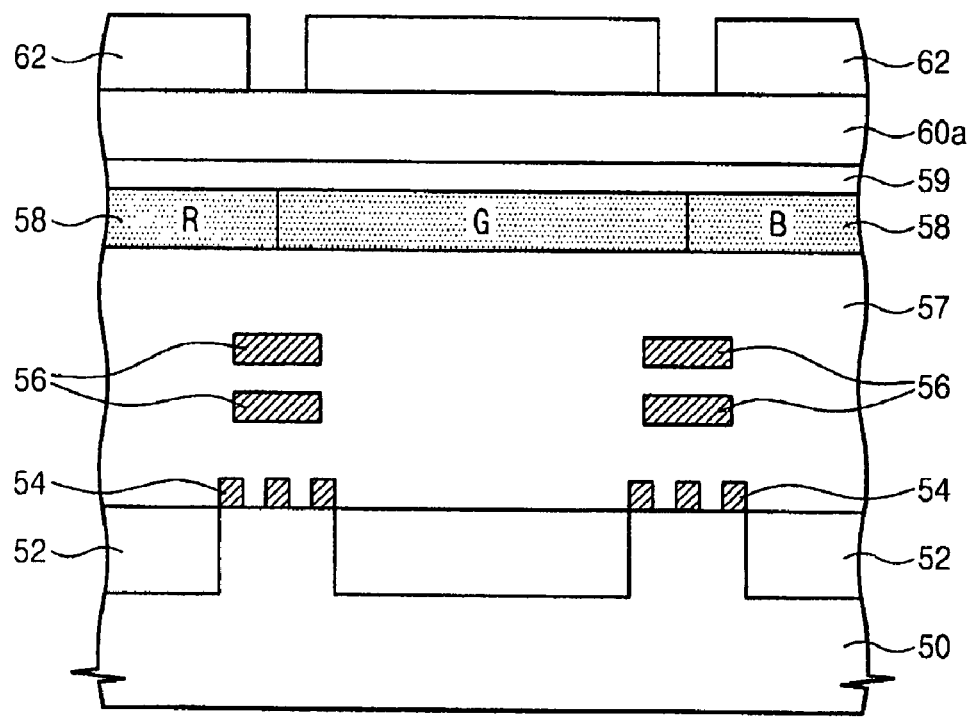

Next, as illustrated in FIG. 3, an apochromatic layer 60a may be formed on the insulation layer 59 via, e.g., vapor deposition, solid-state crystal growth, and so forth. The apochromatic layer 60a may be made of a low dispersion, transparent material. For example, the apochromatic layer 60a may be made of a fluorite-crystalline material, e.g., calcium difluoride ($CaF_2$), or a transmissive material with apochromatic properties.

If the apochromatic layer 60a is deposited by vapor deposition, separate sources of, e.g., fluorine and calcium, may be supplied to grow, e.g., a calcium difluoride crystal layer, on the insulation layer 59. If the apochromatic layer 60a is deposited by solid-state crystal growth, precursor sources of, e.g., fluoride and calcium, may be deposited by, e.g., sputtering or vapor deposition, on the insulation layer 59, followed by heating thereof to a crystal-growing temperature in order to grow, e.g., a calcium difluoride crystal layer, on the insulation layer 59. Fluorine precursors may include one or more of hydrogen fluoride (HF), potassium fluoride (KF), barium difluoride ($BaF_2$), calcium hexafluosilicate ($CaSiF_6$), and so forth. Calcium precursors may include one or more of alkaline-earth metal carbonate, calcium dichloride ($CaCl_2$), and so forth.

Once the apochromatic layer 60a is formed, a mask 62 may be formed on the apochromatic layer 60a. The mask 62 may have patterns substantially corresponding to the color filters of the color filter layer 58, i.e., each pattern may be formed to overlap a corresponding color filter. The mask 62 may be made of a thermosetting material, i.e., a material exhibiting an increased flexibility upon heating, such as a photoresist material.

Figure 4:
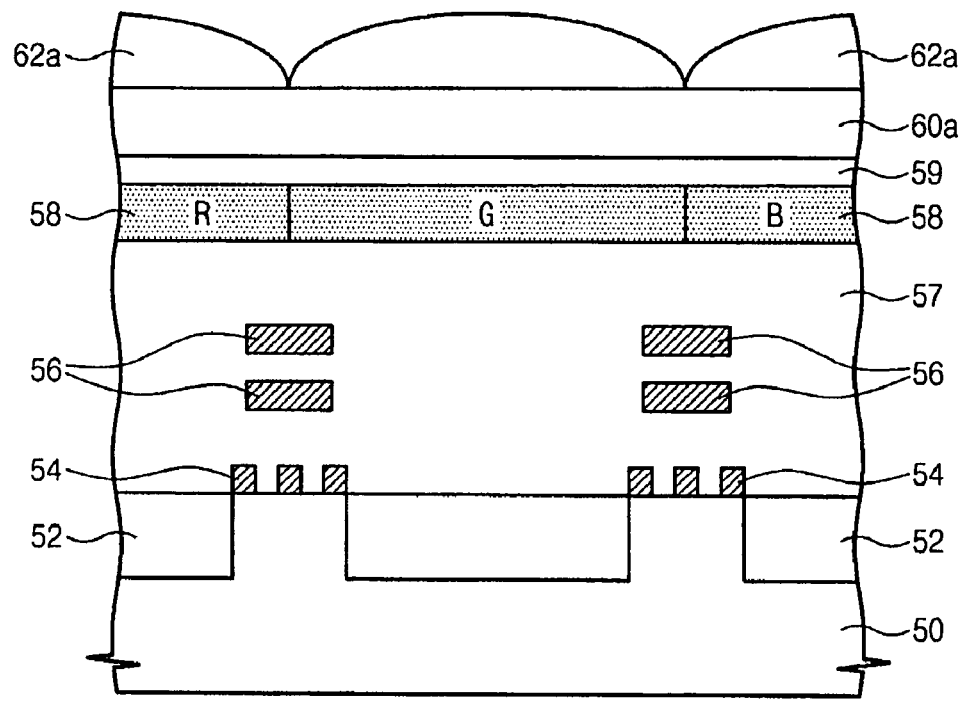

Next, as illustrated in FIG. 4, the mask 62 may be heated to a predetermined temperature, so the patterns thereof may form a sacrificial pattern 62a. The sacrificial pattern 62a may have a plurality of surface curvatures, such that convex surfaces thereof may face away from the apochromatic layer 60a. More specifically, the mask 62 may be heated to such a temperature that the thermosetting material of the patterns thereof may exhibit sufficient flowability to deform into the surface curvatures of the sacrificial pattern 62a and to maintain such form due to surface tension. The predetermined temperature and time required for imparting sufficient flowability to the mask 62 may be controlled and adjusted with respect to a desired curvature radius of the sacrificial pattern 62a.

Figure 5:
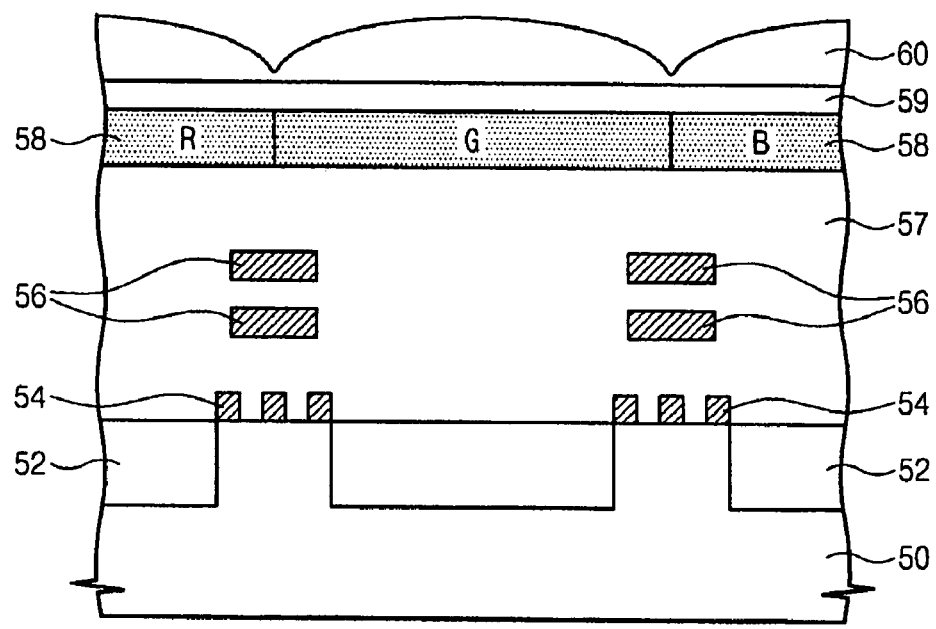

Subsequently, as illustrated in FIG. 5, the sacrificial pattern 62a and the apochromatic layer 60a may be sequentially etched to transfer the surface curvature of the sacrificial pattern 62a onto the apochromatic layer 60a. As a result, the apochromatic layer 60a may be curved to have convex surface curvatures to form the microlenses 60. The curvature radius of the microlenses 60 may be substantially similar to the curvature radius of the sacrificial pattern 62a, so that the predetermined temperature and time employed to form the sacrificial pattern 62a may determine the focal points of the microlenses 60.

The microlens of the image sensor according to an embodiment of the present invention may be apochromatic to minimize chromatic aberration thereof in order to provide a substantially uniform focal length to the color filter layer regardless of wavelengths, thereby substantially increasing light convergence efficiency in the photoelectric conversion areas of the image sensor.

Exemplary embodiments of the present invention has been disclosed herein, and although specific terms are employed, they are used and are to be interpreted in a generic and descriptive sense only and not for purpose of limitation. Accordingly, it will be understood by those skilled in the art that various changes in form and details may be made without departing from the scope and spirit of the present invention as set forth in the following claims.

What is claimed is:

1. An image sensor, comprising:
   at least one photoelectric conversion area on a semiconductor substrate;
   a color filter over the photoelectric conversion area; and
   an apochromatic microlens over the color filter, apochromatic microlens being made of a low dispersion material.

2. The image sensor as recited as claimed in claim 1, wherein the apochromatic microlens includes a fluorite-crystalline.

3. The image sensor as recited as claimed in claim 2, wherein the apochromatic microlens is a calcium difluoride microlens.

4. The image sensor as recited as claimed in claim 2, wherein the image sensor is a complimentary metal-oxide semiconductor or a charge-coupled device.

5. The image sensor as recited as claimed in claim 1, further comprising a plurality of apochromatic microlenses.

6. A method for fabricating an image sensor, comprising:
   forming at least one photoelectric conversion area on a semiconductor substrate;
   forming a color filter over the photoelectric conversion area; and
   forming an apochromatic microlens from a low dispersion material over the color filter.

7. The method as claimed in claim 6, wherein forming the apochromatic microlens includes depositing an apochromatic layer on the color filter, and etching the apochromatic layer to form at least one curvature therein.

8. The method as recited as claimed in claim 7, wherein depositing the apochromatic layer includes vapor deposition or solid-state crystal growth.

9. The method as claimed in claim 7, wherein etching the apochromatic layer includes forming a sacrificial pattern with a predetermined curvature on the apochromatic layer, and successively etching the sacrificial pattern and the apochromatic layer, such that the predetermined curvature is transferred to the apochromatic layer.

10. The method as recited as claimed in claim 6, wherein forming the sacrificial pattern includes forming a mask with a pattern on the apochromatic layer, and deforming the pattern to form the predetermined curvature.

11. The method as recited as claimed in claim 10, wherein forming the sacrificial pattern includes forming a mask of a thermosetting resin.

12. The method as recited as claimed in claim 10, wherein forming the sacrificial pattern includes heating the mask.

13. The method as recited as claimed in claim 6, wherein forming the apochromatic microlens includes forming the microlens of a fluorite-crystalline material.

14. The method as recited as claimed in claim 6, wherein forming the apochromatic microlens includes forming the microlens of a calcium difluoride crystal.

15. The method as recited as claimed in claim 14, wherein forming the apochromatic microlens of the calcium difluoride crystal includes a vapor deposition or a solid-state crystal growth.

16. The method as recited as claimed in claim 15, wherein forming the apochromatic microlens of the calcium difluoride crystal includes using hydrogen fluoride and alkaline-earth metal carbonate.

17. The method as recited as claimed in claim 15, wherein forming the apochromatic microlens of the calcium difluoride crystal includes using potassium fluoride and calcium dichloride.

18. The method as recited as claimed in claim 15, wherein forming the apochromatic microlens of the calcium difluoride crystal includes using barium difluoride and calcium dichloride.

19. The method as recited as claimed in claim 15, wherein forming the apochromatic microlens of the calcium difluoride crystal includes using calcium hexafluosilicate and calcium dichloride.

* * * * *